(12) United States Patent
Wang

(10) Patent No.: US 8,389,356 B2
(45) Date of Patent: Mar. 5, 2013

(54) FLASH CELL WITH FLOATING GATE TRANSISTORS FORMED USING SPACER TECHNOLOGY

(75) Inventor: Yimin Wang, Camas, WA (US)

(73) Assignee: Wafertech, LLC, Camas, WA (US)

( * ) Notice: Subject to any disclaimer, the term of this patent is extended or adjusted under 35 U.S.C. 154(b) by 0 days.

(21) Appl. No.: 13/045,449

(22) Filed: Mar. 10, 2011

(65) Prior Publication Data

US 2012/0231594 A1  Sep. 13, 2012

(51) Int. Cl.
*H01L 21/336* (2006.01)
(52) U.S. Cl. ............... 438/257; 257/E21.422; 438/266
(58) Field of Classification Search ........... 438/257–267
See application file for complete search history.

(56) References Cited

U.S. PATENT DOCUMENTS

| | | | |
|---|---|---|---|
| 6,740,557 B1 * | 5/2004 | Lin ............................... | 438/267 |
| 6,847,068 B2 * | 1/2005 | Chuang et al. ................ | 257/260 |
| 6,869,842 B2 * | 3/2005 | Chang et al. .................. | 438/257 |
| 7,351,629 B2 * | 4/2008 | Choi et al. ..................... | 438/211 |
| 7,354,825 B2 * | 4/2008 | Seo ............................... | 438/267 |
| 7,642,156 B2 * | 1/2010 | Kim ............................... | 438/253 |
| 7,652,322 B2 * | 1/2010 | Choi et al. ..................... | 257/316 |
| 7,679,126 B2 * | 3/2010 | Jung ............................. | 257/314 |
| 2001/0019150 A1 * | 9/2001 | Kawai et al. ................. | 257/315 |

* cited by examiner

*Primary Examiner* — Savitr Mulpuri
(74) *Attorney, Agent, or Firm* — Duane Morris LLP

(57) ABSTRACT

Methods for forming split gate flash cell structures provide for symmetrical cells that are immune to misalignment of the photoresist pattern when forming the control gates. Spacers are utilized to form the floating gates in the floating gate transistors used in the flash cells. The spacers may be oxide spacers used to mask a polysilicon layer that will form the floating gates or the spacers may be polysilicon spacers that will themselves form the floating gates. The inter-gate oxide of the floating gate transistors may be formed using HTO or may be deposited. Hard mask spacers are used in conjunction with the control gate photoresist patterning operation to control the size and configuration of the control gate and the channel length.

15 Claims, 9 Drawing Sheets

FLASH CELL WITH FLOATING GATE TRANSISTORS FORMED USING SPACER TECHNOLOGY

TECHNICAL FIELD

The disclosure relates to semiconductor flash memory devices and methods for making the same.

BACKGROUND

A flash memory is a non-volatile storage device that can be electrically erased and reprogrammed. Flash memories are commonly used in memory cards, USB flash drives and solid-state drives for general storage and transfer of data between computers and other digital products. Flash memory devices typically store information in an array of memory cells made using floating gate transistors.

A floating gate transistor is a field effect transistor having a structure similar to a conventional MOSFET (metal oxide semiconductor field effect transistor). Floating gate MOSFETs are distinguished from conventional MOSFETs because the floating gate transistor includes two gates instead of one. In addition to an upper control gate, a floating gate transistor includes an additional floating gate beneath the control gate and above the transistor channel but completely electrically isolated by an insulating layer such as an oxide layer that completely surrounds the floating gate. This electrically isolated floating gate creates a floating node in DC with a number of inputs or secondary gates such as the control gate, formed above the floating gate and electrically isolated from it. These secondary gates or inputs are only capacitively connected to the floating gate. Because the floating gate is completely surrounded by highly resistive material, i.e. the insulating layer, any charge placed on the floating gate is trapped there and the floating gate remains unchanged for long periods of time until the floating gate MOSFET is erased. Unless erased, the floating gate will not discharge for many years under normal conditions. Fowler-Nordheim Tunneling or other Hot-Carrier injection mechanisms may be used to modify the amount of charge stored in the floating gate, e.g. to erase the floating gate. The erase operation is therefore critical to the operation of floating gate transistors.

The default state of an NOR ("Not Or" electronic logic gate) flash cell is logically equivalent to a binary "one" value because current flows through the channel under application of an appropriate voltage to the control gate when charge is stored in the floating gate. Such a flash cell device can be programmed or set to binary "zero" by applying an elevated voltage to the control gate.

To erase such a flash cell, i.e. resetting it to the "one" state, a large voltage of the opposite polarity is applied between the control gate and the source causing electrons to exit the floating gate through quantum tunneling. In this manner, the electrical charge is removed from the floating gate. This tunneling necessarily takes place through the inter-gate dielectric formed between the floating gate and the control gate. It is therefore important to provide a floating gate transistor having a floating gate and an inter-gate dielectric with appropriate shapes and thicknesses that will promote the creation of a strong electric field that enables tunneling and allows for the flash cell device to be erased.

One conventional method for forming the inter-gate dielectric includes locally oxidizing an exposed portion of polysilicon that will form the floating gate, the localized portion being an exposed portion of polysilicon hot covered by an oxidation resistant film such as silicon nitride. This thermal oxidation of polysilicon includes a high thermal budget, which is generally undesirable in CMOS (Complimentary Metal Oxide Semiconductor) technology. It would therefore be desirable to form floating gate transistors utilizing a lowered thermal budget.

In split gate flash cell technology, a common drain is typically formed in the substrate between two adjacent floating gate transistors. The common drain is commonly formed between the control gates of adjacent floating gate transistors and misalignment issues associated with patterning the control gate material can result in the common drain being improperly positioned and the control gates of adjacent floating gate transistors having different lengths. This is especially undesirable as this results in different channel lengths of the floating gate transistors and therefore different operational characteristics of the transistors.

Conventional split gate flash cells, adjacent floating gate transistors using a common drain and methods for making the same are therefore beset with a number of limitations and shortcomings.

BRIEF DESCRIPTION OF THE DRAWING

Aspects of the invention are best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Various aspects of the embodiments provide for the fabrication of split gate flash cells that include floating gate transistors. Aspects of the embodiments provide for using spacer technology to produce floating gates for the floating gate transistors in the flash cell device and for using methods other than the more conventional LOCOS, local oxidation of silicon, methods used to form the inter-gate dielectric in floating gate transistors. Aspects of the embodiments also provide for accurately forming control gates having desired widths using methods that compensate for any potential misalignment in the photoresist patterning operation. Aspects of the embodiments also provide for forming symmetrical flash cell structures.

Figure 1A:
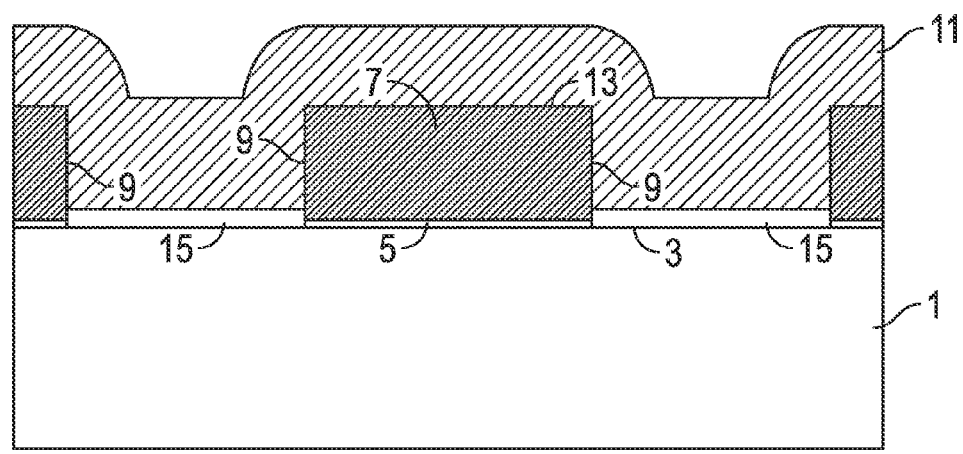
FIGS. 1A-1J are cross-sectional views illustrating a sequence of processing operations to form a flash cell device according to one exemplary embodiment of the invention.

FIGS. 1A-1J are cross-sectional views showing a sequence of processing operations used to form a split gate flash cell device according to one embodiment of the invention. FIG. 1A shows substrate 1 having oxide layer 5 and gate dielectric 15 formed over upper surface 3. Patterned sacrificial layer 7 is formed over oxide layer 5 which may be a pad oxide or a buffer oxide and may include a thickness ranging from about 100 to about 250 Angstroms. Known processing operations may be used to form the films. Gate dielectric 15 is formed in areas not covered by patterned sacrificial layer 7, after patterned sacrificial layer 7 is formed. Various gate dielectric materials such as silicon dioxide or other suitable materials such as high-k or low-k dielectric materials, may be used.

Various suitable semiconductor substrates may be used as substrate 1. Patterned sacrificial layer 7 is formed as a blanket layer, over oxide layer 5 and patterned into separate segments using conventional methods. Patterned sacrificial layer 7 may advantageously be silicon nitride or silicon oxynitride according to various exemplary embodiments and includes sidewalls 9 which are substantially vertical. Although not illustrated or described in detail, various additional processing operations such as suitable implant operations may be carried out with patterned sacrificial layer 7 in place, such as but not limited to implantation operations associated with the subsequent formation of floating gate transistor devices, as will be discussed infra.

Silicon layer 11 is formed over and covering patterned sacrificial layer 7 and also over gate dielectric 15. Silicon layer 11 may advantageously be doped or undoped polysilicon. Silicon layer 11 will be formed to a suitable thickness such that the subsequently formed silicon spacers (see FIG. 1B) will extend up to top surface 13 of patterned sacrificial layer 7.

Figure 1B:
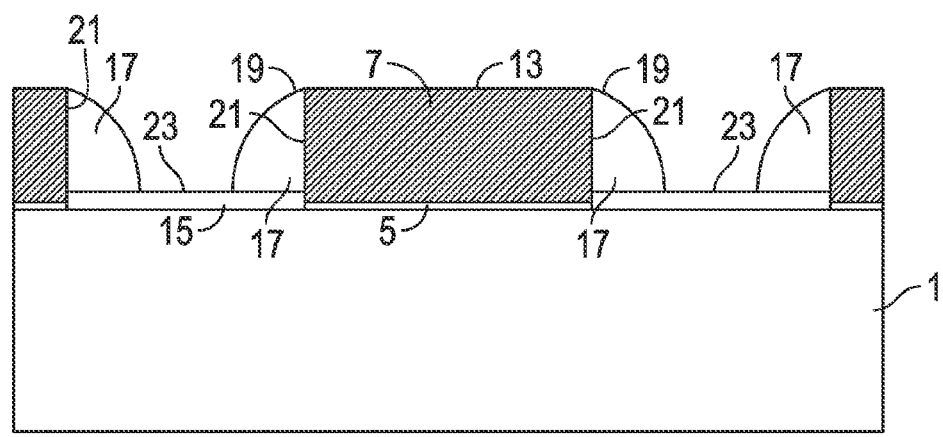

Conventional anisotropic etching procedures may be used to form spacers 17 from silicon layer 11 as shown in FIG. 1B. Spacers 17 each include curved outer surface 19 and vertical face 21. Silicon layer 11 is etched so that top surface 13 of patterned sacrificial layer 7 is exposed and also so that exposed surface 23 of gate dielectric 15 is exposed as illustrated in FIG. 1B.

Figure 1C:
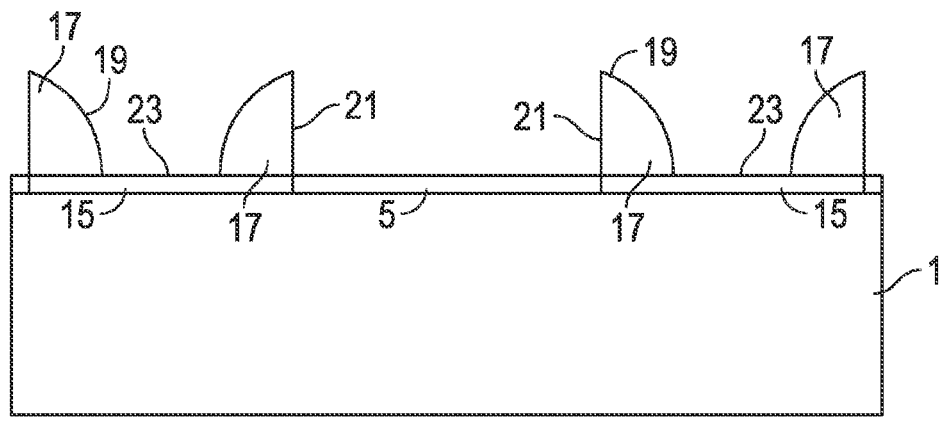

FIG. 1C shows the structure of FIG. 1B after patterned sacrificial layer 7 has been removed. Conventional selective wet etching or other methods may be used.

Figure 1D:
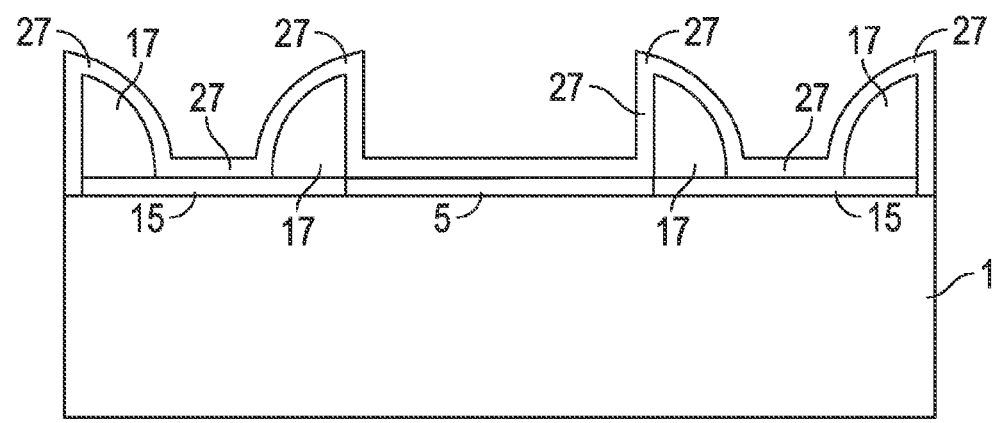

FIG. 1D shows the structure of FIG. 1C after a further oxide has been formed over the structure shown in FIG. 1C. Further oxide 27 may be formed thermally such as by HTO (high temperature oxidation) growth or further oxide 27 may be deposited using TEOS, tetraethyl orthosilicate, deposition techniques or other suitable CVD, PVD, PECVD or other operations. Further oxide 27 may include a thickness ranging from about 100 to about 250 angstroms, but other thicknesses may be used in other exemplary embodiments.

Figure 1E:
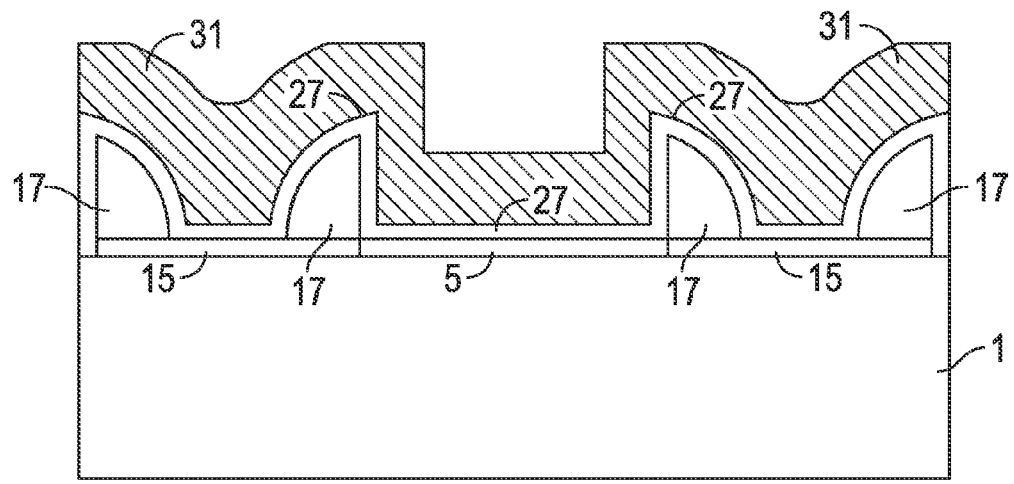

FIG. 1E shows the structure of FIG. 10 after second silicon layer 31 has been conformally formed over the structure of FIG. 1D. Second silicon layer 31 may advantageously be doped or undoped polysilicon and will be used as the control gate for floating gate transistors formed using spacers 17 as the floating gates. Conventional methods and suitable thicknesses may be used in the formation of second silicon layer 31.

Figure 1F:
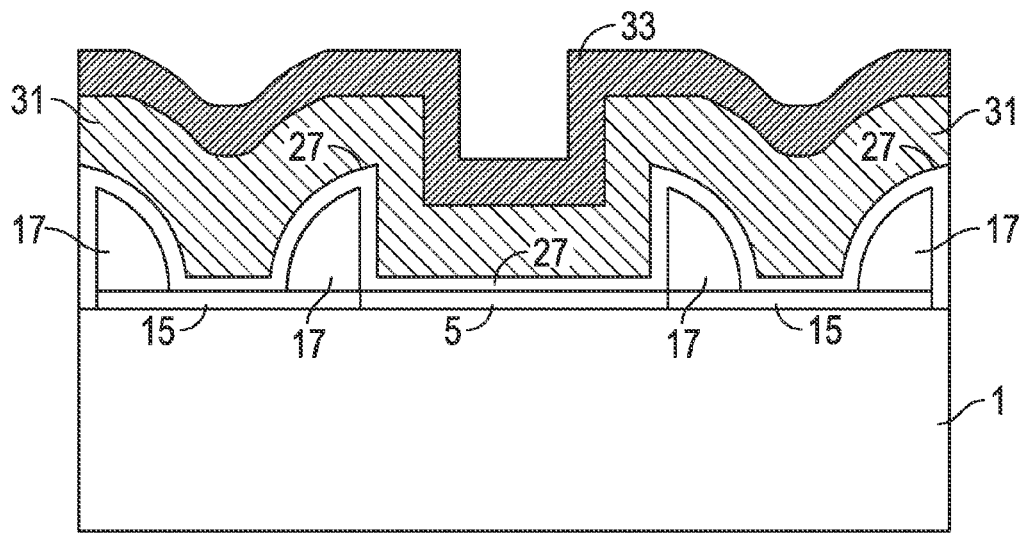

FIG. 1F shows nitride layer 33 conformally formed over second silicon layer 31. Other suitable hardmask materials may be used instead of nitride layer 33 in other exemplary embodiments.

Figure 1G:
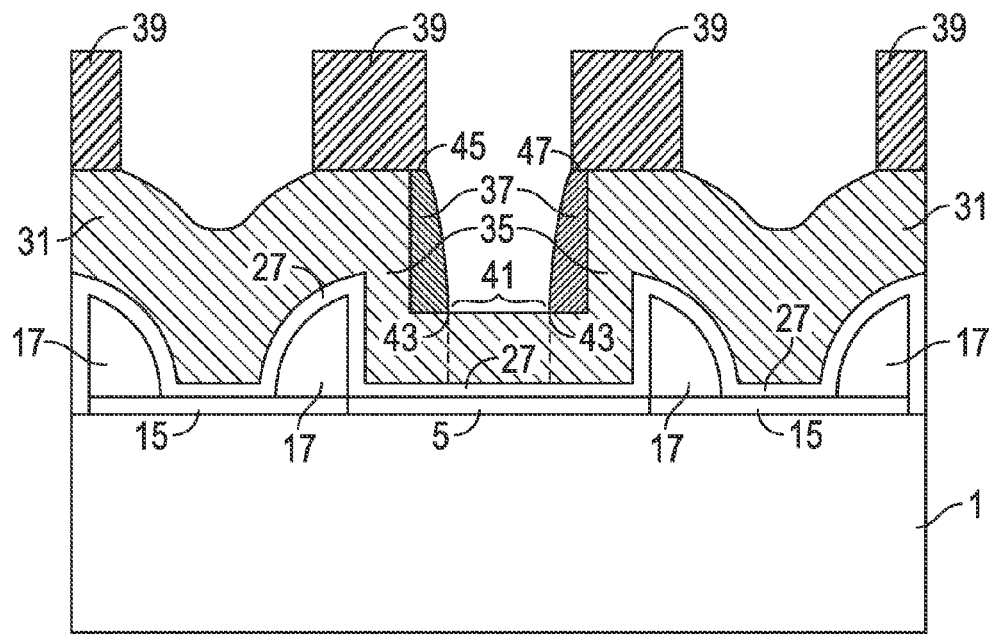

Nitride layer 33 is etched using an anisotropic etching process to form spacers 37 shown in FIG. 1G. Spacers 37 are formed along vertical sections 35 of second silicon layer 31 by conventional anisotropic selective etching processes and will be used as hardmasks during a subsequent etching operation. Vertical sections 35 are disposed along vertical faces 21 of spacers 17. More particularly, vertical sections 35 are spaced apart from vertical faces 21 by further oxide 27. Drain spacing 41 is defined by spacers 37. More particularly, drain spacing 41 is the exposed area of silicon layer 11 between lateral edges 43 of adjacent spacers 37. Drain spacing 41 will determine the location of a common drain formed between floating gate transistors formed to the left and right hand sides of drain spacing 41. Lateral edges 43 also determine the lateral extent and therefore the gate length of a control gate that will be formed from second silicon layer 31.

Patterned photoresist layer 39 is formed over the structure including over second silicon layer 31 and spacers 37. An anisotropic etching process will be carried out upon the structure shown in FIG. 1G to remove portions of second silicon layer 31 not covered by either photoresist layer 39 or spacers 37. In this manner, it will be seen that the location of the common drain area and at least one edge of the control gate will be determined by lateral edge 43 of spacer 37 and therefore immune to any problems caused by misalignment or misplacement of patterned photoresist layer 39 such as the different relative positions of edges 45 and 47 in the illustrated embodiment. Even though edge 47 is disposed closer to drain spacing 41 than is edge 45, this misalignment or different relative position of patterned photoresist layer 39 will not result in misalignment of a common drain and will also not result in different lengths of the control gates formed using an etch process in which both the patterned photoresist layer 39 and spacer 37 serve as a combined mask.

Figure 1H:
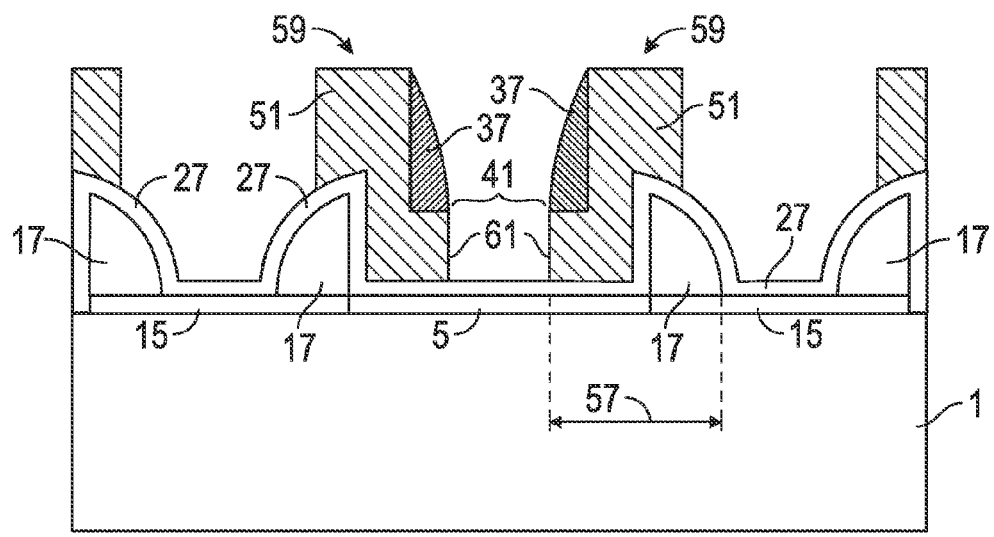

FIG. 1H shows the structure of FIG. 1G after such an anisotropic silicon etching procedure is carried out and after patterned photoresist layer 39 has been removed after the etching process. During the etching operation in which both the patterned photoresist layer 39 and spacer 37 serve as a combined mask, portions of second silicon layer 31 not covered by either photoresist layer 39 or spacers 37, are etched away to produce control gates 51.

FIG. 1H shows control gates 51 formed from second silicon layer 31 and also shows that second silicon layer 31 has been removed from drain spacing 41. Floating gate transistor structure 59 includes a floating gate formed of spacer 17 and surrounded by insulation in the form of further oxide 27 and gate dielectric 15. Floating gate transistor structure 59 includes control gate 51 and channel 55 includes channel length 57 that terminates at edge 61 of control gate 51.

Further processing operations are next carried out to form a flash cell device including a split cell floating gate transistor structure.

Figure 1I:
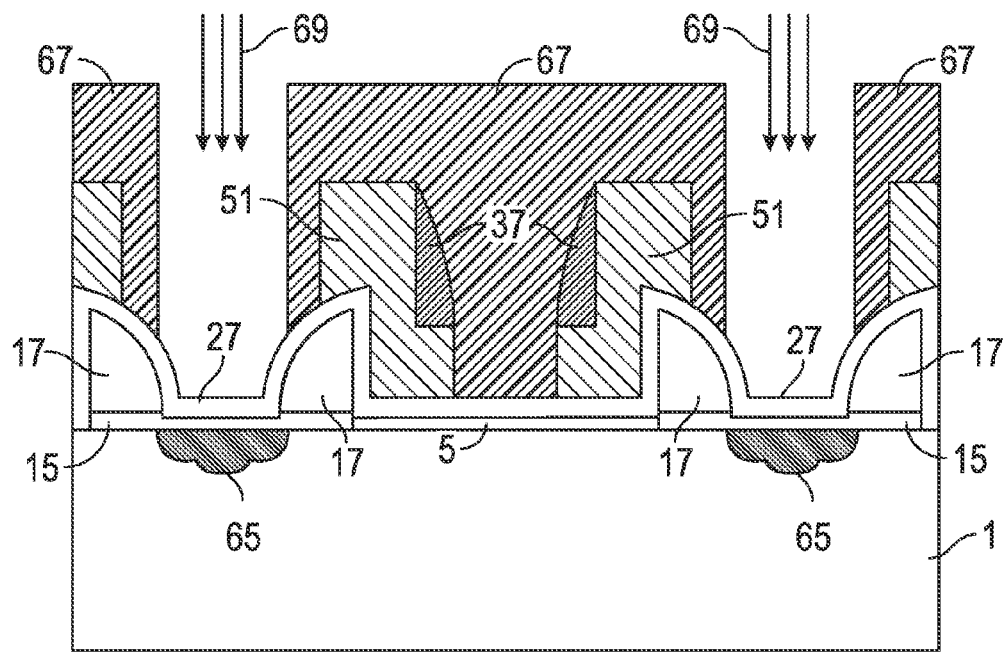

FIG. 1I shows the structure of FIG. 1H with patterned photoresist layer 67 serving as a masking layer during an implantation operation. An ion implantation operation indicated by arrows 69 is used to implant suitable species into substrate 1 and form source areas 65 therein and between adjacent floating gate transistors. After the implantation operation, photoresist layer 67 is removed.

Figure 1J:
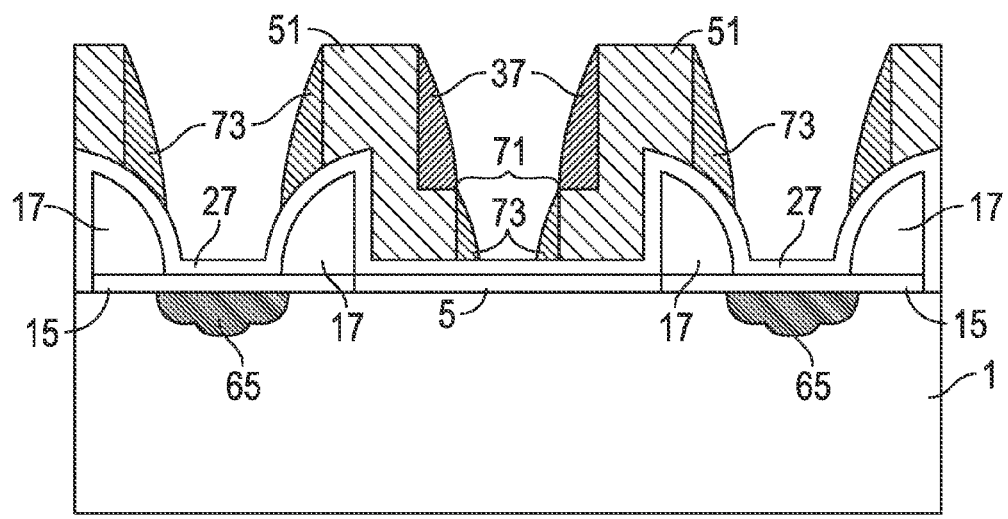

Now turning to FIG. 1J, the illustrated structure is shown after photoresist layer 67 has been removed and secondary spacers 73 have been formed. Secondary spacers 73 may be formed of oxide, nitride or a combination thereof and may be formed using conventional deposition techniques and conventional anisotropic etching techniques. Secondary spacers 73 will influence the size and location of exposed area 71 within which a common drain may be formed by using conventional ion implantation operations. The common drain area may serve the floating gate transistors formed from floating gate transistor structures 59, to the left and right of the common drain area. The common drain area may be contacted by a bit line formed to extend through an interlevel dielectric formed over a structure such as the structure shown in FIG. 1J. Silicides may be formed on control gate 51, source area 65 or on the common drain formed exposed area 71. A word line may be coupled to control gate 51, preferably to a suicide formed on control gate 51. Various other conventional and suitable processing operations may be carried out to form various floating gate transistors and split gate flash cells using the structure shown in FIG. 1J. Conventional means for coupling the electronic components such as the word line, bit line and source line may be utilized.

The exemplary sequence of processing operations described supra, provides silicon spacers that are generally D-shaped or that have a horizontal surface, a vertical surface and a convex surface therebetween. These silicon spacers will serve as the gates for floating gate transistors. According to the following exemplary embodiment described in conjunction with FIGS. 2A-2H, a sequence of processing operations uses a deposited oxide film as a spacer to produce a generally L-shaped floating gate out of a deposited silicon layer.

Figure 2A:
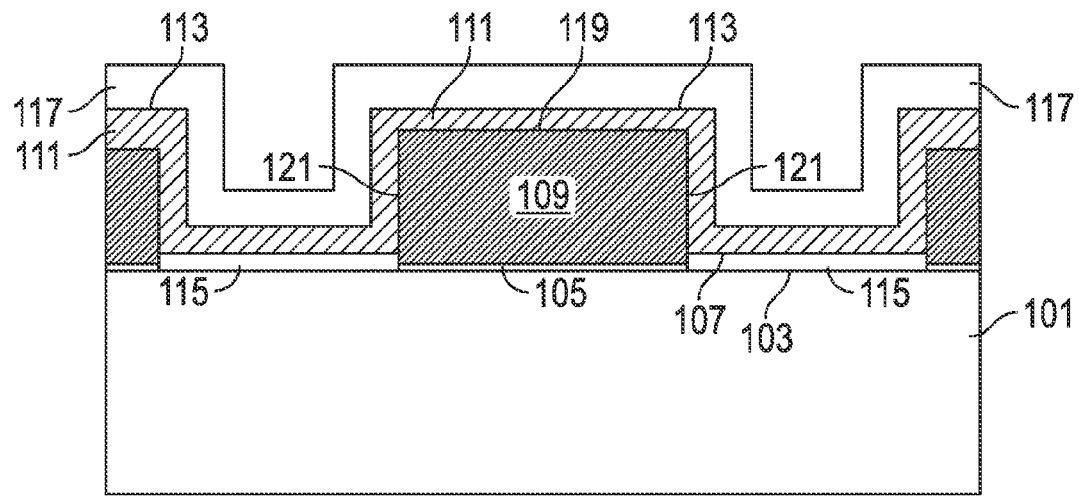
FIGS. 2A-2H are cross-sectional views illustrating another sequence of processing operations to form a flash cell device according to another exemplary embodiment of the invention.

Now turning to FIG. 2A, substrate 101 may be any of various suitable semiconductor substrates used in the semiconductor manufacturing industry. Oxide layer 105 is formed over substrate 101 and may be a pad oxide or a buffer oxide and may include a thickness ranging from about 100 to about 250 angstroms. Patterned sacrificial layer 109 may advantageously be silicon nitride but patterned sacrificial layer 109 may be another nitride or oxynitride layer, or other suitable materials according to various exemplary embodiments and may be formed and patterned using conventional techniques. Patterned sacrificial layer 109 is patterned into individual segments having sidewalls 121. In between the discrete segments of patterned sacrificial layer 109, gate dielectric 115 is formed over surface 103 of substrate 101. Gate dielectric 115 is formed on substrate 101 after patterned sacrificial layer 7 is formed and patterned. Various gate dielectric materials such as silicon dioxide or other suitable materials such as high-k or low-k dielectric materials, may be used. Although not illustrated or described in detail, various additional processing operations such as suitable ion implantation operations may be carried out with patterned sacrificial layer 109 in place, such as but not limited to implantation operations associated with the subsequent formation of floating gate transistor devices, as will be discussed infra.

Silicon layer 111 may advantageously be polysilicon and may be doped or undoped, but various other silicon materials may be used in other exemplary embodiments. Silicon layer 111 may include a thickness ranging from about 300 to 1000 angstroms, but other thicknesses may be used in other exemplary embodiments. Silicon layer 111 is formed conformally over and covering the segments of patterned sacrificial layer 109 including over top surface 119 and along sidewalls 121. Oxide layer 117 is formed over silicon layer 111 and oxide layer 117 may advantageously be formed using TEOS, tetraethyl orthosilicate, or other suitable CVD, PVD, PECVD or other deposition operations. Oxide layer 117 may include a thickness ranging from about 500 to about 2000 angstroms, but other thicknesses may be used in other exemplary embodiments. The thickness of oxide layer 117 will be chosen in conjunction with the dimensions of the floating gate sought, as will be clear from the following figures which illustrate that spacers are formed from oxide layer 117 and influence the size of the floating gates.

Figure 2B:
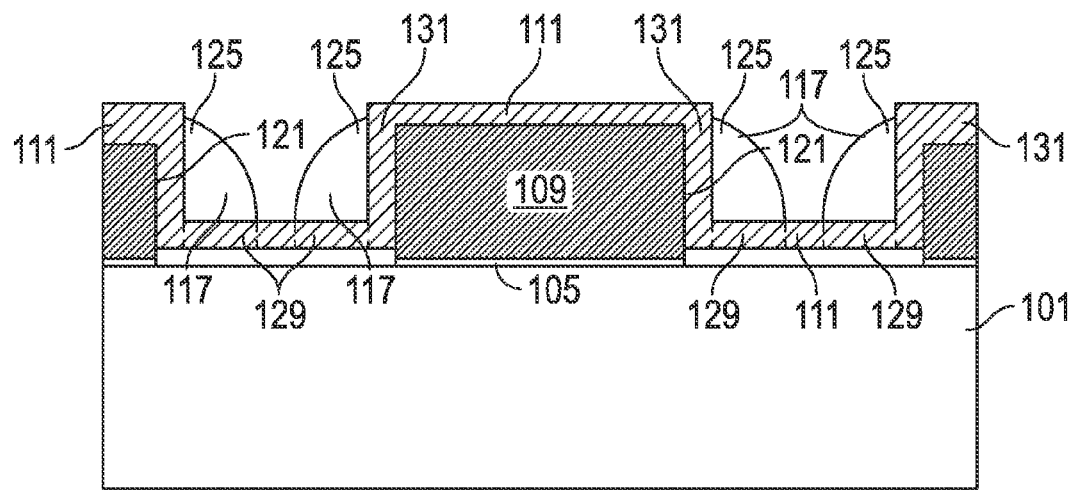

FIG. 2B shows spacers 125 formed from oxide layer 117. Conventional anisotropic and selective etching techniques may be used to form spacers 125. Spacers 125 are formed along vertical portions 131 of silicon layer 111, which are formed alongside sidewalls 121 of patterned sacrificial layer 109. Spacers 125 cover horizontal portions 129 of silicon layer 111.

Figure 2C:
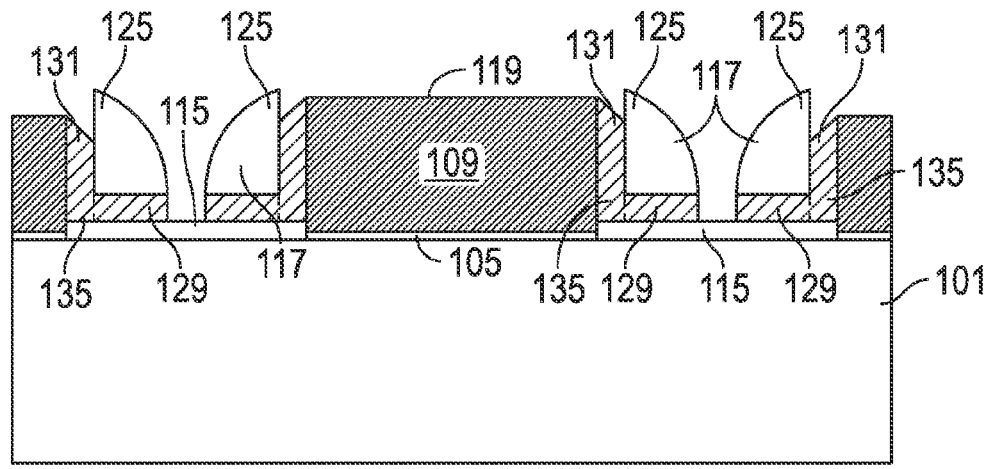

Next, an anisotropic silicon etching operation is carried out upon the structure shown in FIG. 2B, to produce the structure shown in FIG. 2C. A selective etching process is used to remove uncovered portions of silicon layer 111 that are not covered and protected by spacers 125. FIG. 2C shows unprotected, i.e. unmasked, portions of silicon layer 111 having been removed to form floating gates 135 which include vertical portions 131 and horizontal portions 129. Silicon layer 111 has been removed from over top surface 119 of patterned sacrificial layer 109. Floating gates 135 are generally L-shaped and include horizontal sections 129 and vertical sections 131. The silicon etching may take place after a photoresist pattern is formed to additionally pattern silicon layer 111 which is removed from portions not illustrated in the cross-section of FIG. 2C, to form floating gates 135.

Figure 2D:
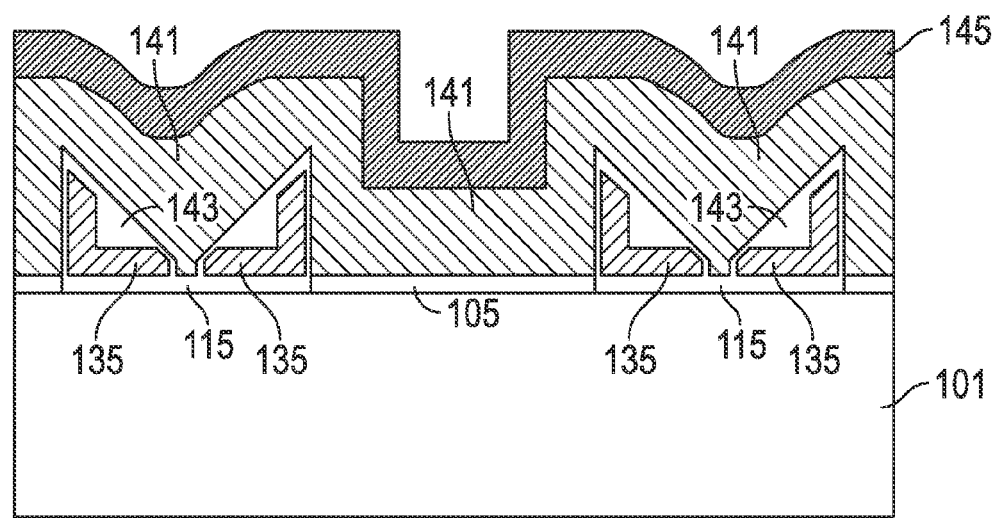

FIG. 2D shows second silicon layer 141 formed over floating gates 135 and oxide 143. Conventional deposition techniques may be used to form second silicon layer 141. Oxide 143 is the floating gate inter-gate oxide and is formed by performing a wet dip upon the structure shown in FIG. 2C then performing oxide re-growth or oxide deposition process, prior to formation of second silicon layer 141. Second silicon layer 141 may advantageously be polysilicon, doped or undoped, but other suitable silicon materials may be used in other exemplary embodiments. Control gates will be formed from second silicon layer 141 as will be shown, infra. Material layer 145 is formed over second silicon layer 141 and may be a nitride or oxide layer and will be used to form spacers. Material layer 145 is a conformally formed layer.

Figure 2E:
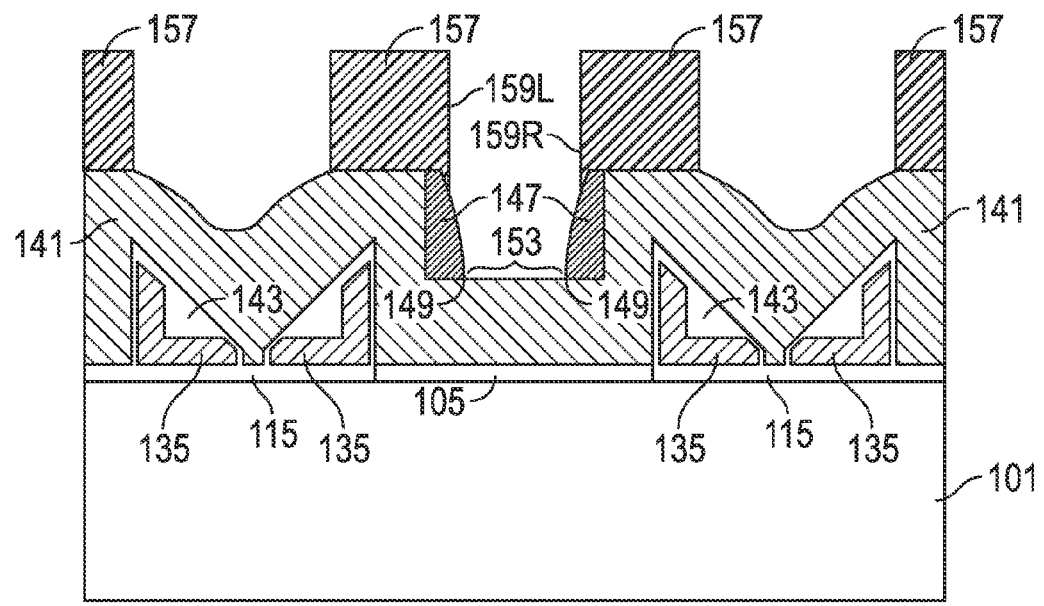

Now turning to FIG. 2E, an anisotropic etching operation is used to form spacers 147 from material layer 145. Similar to the embodiment described in FIG. 1G, spacers 147 include lateral edges 149 which together define drain spacing 153 between spacers 147 and also between adjacent floating gates 135. Drain spacing 153 will determine the location of a common drain formed between floating gate transistors formed to the left and right-hand sides of drain spacing 153. Lateral edges 149 also determine the lateral extent and therefore the gate length of a control gate that will be formed from second silicon layer 141 and associated with the floating gate transistors.

After spacers 147 are formed, patterned photoresist layer 157 is formed over the structure as illustrated. Patterned photoresist layer 157 is conventionally formed and used in conjunction with spacers 147 to define control gates. Lateral edges 159L and 159R of patterned photoresist layer 157 can therefore be slightly misaligned or improperly positioned because of the presence of spacers 147.

Figure 2F:
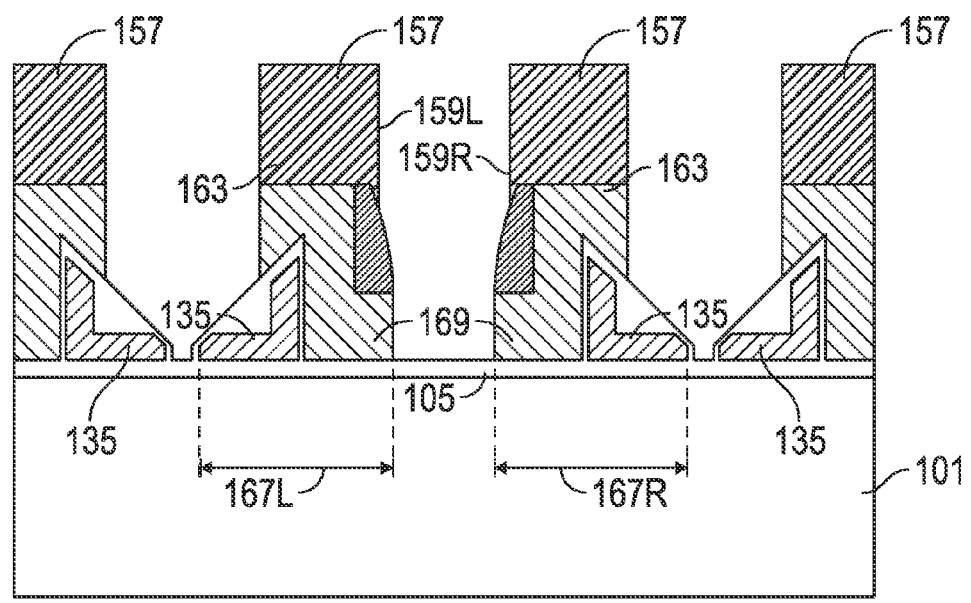

An anisotropic and selective etching process is then carried out upon the structure shown in FIG. 2E to produce the structure shown in FIG. 2F. FIG. 2F shows control gates 163 formed from second silicon layer 141 after the anisotropic etching operation removes portions of second silicon layer 141 that are not covered by patterned photoresist layer 157 or spacers 147. Because of the presence of spacers 147, FIG. 2F shows that, although respective inner edges 159L and 159R are at different distances from their respective floating gates 135, channel lengths 167L and 167R are substantially equal as lower horizontal portions 169 of control gates 163 are also substantially of equal length. After patterned photoresist layer 157 is stripped, a source line implantation operation may take place as shown in FIG. 2G.

Figure 2G:
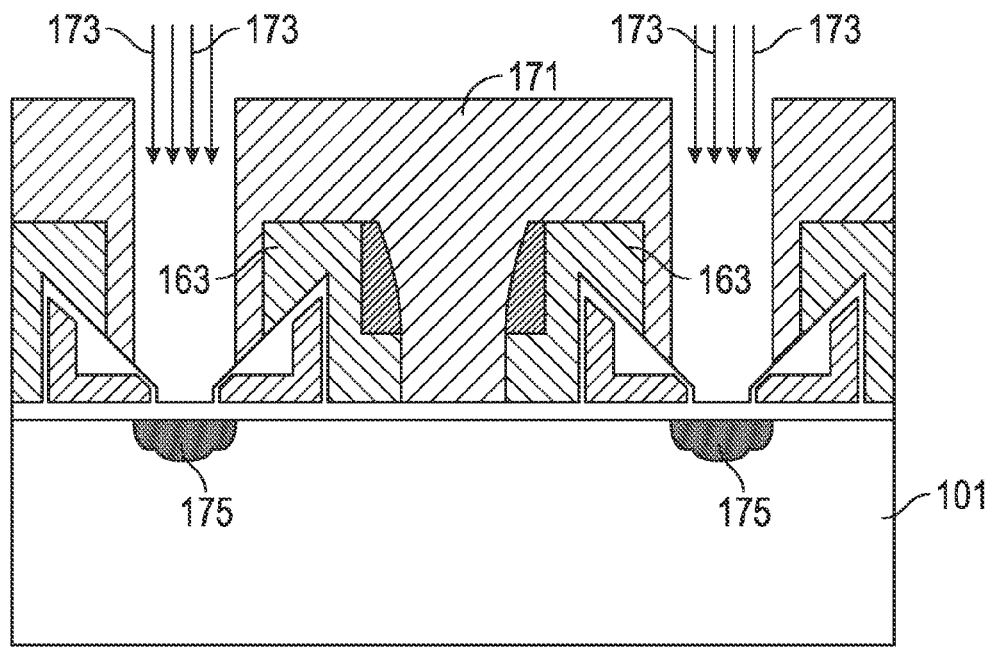

FIG. 2G shows the structure of FIG. 2F after patterned photoresist layer 157 (FIG. 3F) has been removed and a further photoresist layer has been formed. FIG. 2G shows patterned photoresist layer 171 serving as a masking layer during an ion implantation operation. An ion implantation operation indicated by arrows 173 is used to implant suitable species into substrate 101 and to form source areas 175 therein and between adjacent floating gate transistors. After the implantation operation, photoresist layer 171 is removed.

Figure 2H:
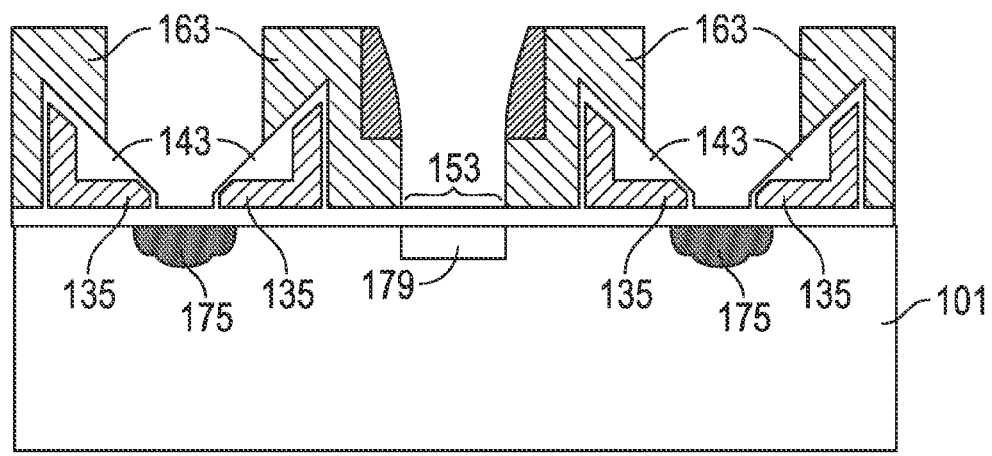

FIG. 2H shows the structure after the photoresist layer 171 has been removed. Further processing operations may take place to form a common drain in drain region 179 formed in substrate 101 at drain spacing 153. According to one exemplary embodiment, secondary spacers may be formed such as secondary spacers 73 shown in FIG. 1J prior to an implantation operation used to form a common drain in substrate 101 in drain region 179. Further processing such as the formation of silicides on the control gates 163, on drain region 179 or on source regions 165, may take place, dielectric materials may be formed over the structure shown in FIG. 2H, and contact openings may be formed to contact the source area and the drain area, for example a bit line may advantageously be formed to contact common drain area. A word line may be coupled to control gates 163, preferably to a silicide formed on control gate 163. Various other conventional and suitable processing operations may be carried out to form various floating gate transistors and split gate flash cells using the structure shown in FIG. 2H. Conventional means for coupling the electronic components such as the word line, bit line and source line may be utilized to form functional devices.

According to one aspect, provided is a method for forming a split gate flash cell. The method comprises forming segments of a sacrificial film over a substrate, the segments bounded by sidewalls; depositing a polysilicon layer covering and interposed between the segments; depositing an oxide over the polysilicon layer; anisotropically etching the oxide to produce spacers therefrom, the spacers disposed adjacent vertical portions of the polysilicon layer that are adjacent the sidewalls. The method further comprises using the spacers as masks and anisotropically etching the polysilicon layer to form polysilicon segments therefrom, each polysilicon segment including a vertical part and a horizontal part; and forming floating gate transistors using the polysilicon segments as the floating gates According to another aspect, provided is a method for forming a split gate flash cell comprising: forming segments of a sacrificial film over a substrate, the segments bounded by sidewalls; depositing a polysilicon layer covering and interposed between the segments and over the dielectric layer; anisotropically etching the polysilicon film to form polysilicon spacers adjacent the sidewalls; and removing the segments of the sacrificial film. The method further comprises depositing an oxide over the polysilicon spacers; and forming floating gate transistors using the polysilicon spacers as the floating gates.

According to another aspect, a method is provided for forming a split gate flash cell comprising: forming a duality of polysilicon floating gates over a gate dielectric, the duality of polysilicon floating gates including vertical sidewalls in confronting relation; depositing a conformal oxide layer over the duality of polysilicon floating gates; and forming a polysilicon layer over the conformed oxide layer over the duality of polysilicon floating gates, the polysilicon layer including vertical portions spaced from the vertical sidewalls by the conformal oxide layer. The method further comprises forming spacers of a sacrificial material along the vertical sections of the polysilicon layer; forming a photoresist layer over the spacers and the polysilicon layer; patterning the photoresist layer; and etching the polysilicon layer and forming control gates from portions of the polysilicon layer not covered by at least one of the spacers and the patterned photoresist.

The preceding merely illustrates the principles of the embodiments and aspects of the invention. It will thus be appreciated that those skilled in the art will be able to devise various arrangements which, although not explicitly described or shown herein, embody the principles of the embodiments of the invention and are included within its spirit and scope. Furthermore, all examples and conditional language recited herein are principally intended expressly to be only for pedagogical purposes and to aid in understanding the principles and the concepts contributed by the inventors to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a split gate flash cell comprising:
   forming segments of a sacrificial film over a substrate, said segments bounded by sidewalls;
   depositing a polysilicon layer covering and interposed between said segments;
   depositing an oxide over said polysilicon layer;
   anisotropically etching said oxide to produce spacers therefrom, said spacers disposed adjacent vertical portions of said polysilicon layer that are adjacent said sidewalls;
   using said spacers as masks and anisotropically etching said polysilicon layer to form polysilicon segments therefrom, each said polysilicon segment including a vertical part and a horizontal part; and
   forming floating gate transistors using said polysilicon segments as said floating gates.

2. The method as in claim 1, wherein said forming segments of a sacrificial film comprise forming said sacrificial film over said substrate and patterning said sacrificial film to form said segments therefrom.

3. The method as in claim 1, wherein said sacrificial film comprises silicon nitride.

4. The method as in claim 1, wherein said anisotropically etching said oxide includes producing said spacers such that said spacers cover horizontal portions of said polysilicon film and wherein said anisotropically etching said polysilicon layer comprises forming said horizontal parts from said horizontal portions.

5. The method as in claim 1, wherein said polysilicon segments are essentially L-shaped.

6. A method for forming a split gate flash cell comprising:
forming segments of a sacrificial film over a substrate, said segments bounded by sidewalls;
depositing a polysilicon layer covering and interposed between said segments;
depositing an oxide over said polysilicon layer;
anisotropically etching said oxide to produce spacers therefrom, said spacers disposed adjacent vertical portions of said polysilicon layer that are adjacent said sidewalls;
using said spacers as masks and anisotropically etching said polysilicon layer to form polysilicon segments therefrom, each said polysilicon segment including a vertical part and a horizontal part;
forming a second polysilicon layer over a further oxide formed over said polysilicon segments;
forming hard mask spacers along vertical sections of said second polysilicon layer thereby forming a mask of at least said hard mask spacers; and
etching portions of said second polysilicon layer not covered by said mask;
forming floating gate transistors using said polysilicon segments as said floating gates,
wherein said depositing a polysilicon layer interposed between said segments comprises depositing said polysilicon layer on a gate dielectric layer formed on said substrate between said segments.

7. The method as in claim 6, further comprising:
forming a photoresist layer over said hard mask spacers and said second polysilicon layer; and
patterning said photoresist layer; and
wherein said mask is a composite mask including said hard mask spacers and said patterned photoresist layer.

8. The method as in claim 7, further comprising removing said segments of said sacrificial film prior to said forming a second polysilicon layer.

9. The method as in claim 7, wherein said floating gates comprise at least two adjacent floating gates having vertical faces facing one another and said vertical sections of said second polysilicon layer are disposed along said vertical faces and further comprising, after said etching said second polysilicon layer, using said etched second polysilicon layer as a mask and implanting to form a common drain area in said substrate between said adjacent floating gates.

10. The method as in claim 7, wherein said depositing an oxide comprises TEOS (tetraethyl orthosilicate) and said further oxide comprises TEOS.

11. A method for forming a split gate flash cell comprising:
forming segments of a sacrificial film over a substrate, said segments bounded by sidewalls;
depositing a polysilicon layer covering and interposed between said segments;
anisotropically etching said polysilicon film to form polysilicon spacers adjacent said sidewalls;
removing said segments of said sacrificial film;
depositing an oxide over said polysilicon spacers; and
forming floating gate transistors using said polysilicon spacers as said floating gates by forming a second polysilicon layer over said oxide formed over said polysilicon spacers;
forming hard mask spacers along vertical sections of said second polysilicon layer; and
etching said second polysilicon layer using at least said hard mask spacers as a mask, thereby removing portions of said second polysilicon layer not covered by said mask.

12. The method as in claim 11, wherein said sacrificial film comprises silicon nitride and said forming segments of a sacrificial film comprises forming said sacrificial film over said substrate and patterning said sacrificial film to form said segments therefrom.

13. The method as in claim 11, wherein said depositing a polysilicon layer interposed between said segments comprises depositing said polysilicon layer on a gate dielectric layer formed on said substrate between said segments.

14. The method as in claim 13, wherein said forming floating gate transistors further includes:
forming a photoresist layer over said hard mask spacers and said second polysilicon layer;
patterning said photoresist layer; and
wherein said mask is a composite mask including said hard mask spacers and said patterned photoresist layer.

15. The method as in claim 14, wherein said floating gates comprise at least two adjacent floating gates having vertical faces facing one another and said vertical sections of said second polysilicon layer are disposed along said vertical faces and further comprising, after said etching said second polysilicon layer, using said etched second polysilicon layer as a mask and implanting to form a common drain area in said substrate between said adjacent floating gates.

* * * * *